US 10,120,000 B2

(12) United States Patent
Turullols (10) Patent No.: US 10,120,000 B2
(45) Date of Patent: Nov. 6, 2018

(54) ON-CHIP CURRENT SENSING EMPLOYING POWER DISTRIBUTION NETWORK VOLTAGE DE-CONVOLUTION

(71) Applicant: ORACLE INTERNATIONAL CORPORATION, Redwood Shores, CA (US)

(72) Inventor: Sebastian Turullols, Los Altos, CA (US)

(73) Assignee: ORACLE INTERNATIONAL CORPORATION, Redwood Shores, CA (US)

(*) Notice: Subject to any disclaimer, the term of this patent is extended or adjusted under 35 U.S.C. 154(b) by 200 days.

(21) Appl. No.: 14/799,664

(22) Filed: Jul. 15, 2015

(65) Prior Publication Data

US 2017/0016939 A1   Jan. 19, 2017

(51) Int. Cl.
| | |
|---|---|
| *G06F 1/00* | (2006.01) |
| *G01R 19/25* | (2006.01) |
| *G01R 19/00* | (2006.01) |
| *G05F 1/10* | (2006.01) |
| *H03H 7/01* | (2006.01) |

(52) U.S. Cl.
CPC ..... *G01R 19/2513* (2013.01); *G01R 19/0092* (2013.01); *G01R 19/2506* (2013.01); *G05F 1/10* (2013.01); *H03H 7/0153* (2013.01)

(58) Field of Classification Search
CPC ............ G01R 19/2513; G01R 19/0092; G01R 19/2506; H03H 7/0153
See application file for complete search history.

(56) References Cited

U.S. PATENT DOCUMENTS

| | | | | |
|---|---|---|---|---|
| 4,851,841 A | * | 7/1989 | Sooch ................... | H03M 3/488 341/143 |
| 2008/0168287 A1 | * | 7/2008 | Berry ...................... | G06F 1/266 713/323 |

(Continued)

FOREIGN PATENT DOCUMENTS

JP     12014215048 A     11/2014

OTHER PUBLICATIONS

Patent Cooperation Treaty (PCT) International Search Report and Written Opinion in co-pending PCT International Appl. No. PCT/US2016/033511 (International Filing Date of May 20, 2016) dated Aug. 9, 2016 (12 pgs.).

(Continued)

*Primary Examiner* — Jaweed A Abbaszadeh
*Assistant Examiner* — Gayathri Sampath
(74) *Attorney, Agent, or Firm* — Kraguljac Law Group, LLC (57) ABSTRACT

Systems, methods, and other embodiments are disclosed that are configured to provide on-chip current sensing by employing a power distribution network voltage de-convolution technique. A voltage signal on a voltage plane of a system-on-chip device is measured during operation of the system-on-chip device. The voltage signal derives from a power distribution network. The voltage signal is de-convolved, based at least in part on inverse convolution coefficients derived from the power distribution network, to recover a current signal being drawn by the system-on-chip device from the power distribution network.

20 Claims, 8 Drawing Sheets

(56) References Cited

U.S. PATENT DOCUMENTS

2009/0138219 A1* 5/2009 Bletsch ................ G06F 1/3203
702/60
2016/0033611 A1* 2/2016 Rahardjo ............. G01R 35/005
702/104

OTHER PUBLICATIONS

Lambert W J et al., "Estimation of Microprocessor Instantaneous Load Current", IEEE Transactions on advanced packaging, IEEE service Center, Piscataway, NJ, USA, vol. 32, No. 4, Nov. 1, 2009, pp. 831-840.

Lambert W J et al., "Estimation of Microprocessor Instantaneous Load Current for Voltage Regulator Optimization", Applied Power Electronics Conference and Exposition, 2008. APEC 2008. Twenty-Third Annual IEEE, IEEE, Piscataway, NJ, USA, Feb. 24, 2008, pp. 1453-1459.

* cited by examiner

ON-CHIP CURRENT SENSING EMPLOYING POWER DISTRIBUTION NETWORK VOLTAGE DE-CONVOLUTION

BACKGROUND

In the field of integrated circuit chips (i.e., system-on-chip devices), sensing the current drawn from electrical power sources is often performed to autonomously manage power consumption of the integrated circuit chips. If too much electrical power is drawn from an electrical power source, the electrical power source can shut down or fail (e.g., become damaged). Furthermore, if too much electrical power is drawn by a chip, the chip can get hot and possibly melt. Also, a customer may want the amount of electrical power that a chip consumes to be limited for reasons of utility costs and environmental concerns.

Traditionally, two approaches have been used to sense the current drawn by an integrated circuit chip. A first method measures the current externally in the power source supplying the chip, and then transfers the current information to the chip via dedicated primary inputs. However, such dedicated primary inputs add cost to the chip. A second method involves building a high precision resistor into the chip between the power source and the load, along with a voltage sensor to measure a voltage drop across the resistor during operation. However, this resistor approach wastes power proportional to the square of the current drawn multiplied by the resistance value chosen.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Systems, methods, and other embodiments are disclosed for estimating (recovering) the electrical current drawn by a system-on-chip (SOC) device from a power-distribution network (PDN). By knowing the electrical current being drawn, the electrical power consumed by the SOC device can be managed to avoid over-heating of the SOC device and to avoid damaging the PDN, for example. In one embodiment, the electrical current being drawn by a SOC device is estimated based on the voltage on a voltage plane of the SOC device and an impulse response (and/or transfer function) of the PDN that relates the voltage to the current being drawn. The voltage on the voltage plane is measured within the SOC device and signal processing techniques are employed within the SOC device to recover the electrical current being drawn. A set of de-convolution coefficients (inverse convolution coefficients) derived from the impulse response (and/or transfer function) are used in the signal processing techniques. In this manner, current recovery can be performed on the SOC device in real time, and power consumption of the SOC device can be managed in real time. Thus obtaining the current by deconvolving the measured voltage from the power distribution network eliminates adding a series resistor and eliminates using dedicated primary inputs from an external sensor.

The following terms are used herein with respect to various embodiments.

The term "system-on-chip (SOC) device", as used herein, refers to a single integrated circuit chip configured to perform various systemic functions.

The term "power distribution network (PDN)", as used herein, refers to elements involved in delivering electrical power to a SOC device. Such elements may include electrical components, circuit traces, vias, as well as other elements. For example, a PDN may include a voltage regulation module (VRM). Parts of a PDN may be external to the SOC device, and other parts of the PDN may be internal to the SOC device. For example, in one embodiment, a VRM of the PDN may be external to the SOC device. Circuit traces, vias, and capacitors of the PDN may be internal to the SOC device.

The term "impulse response" as used herein, refers to a time domain relationship between a current drawn by a SOC device from a PDN and a voltage signal occurring on a voltage plane of the SOC device as the current is drawn. Such an impulse response is said to be the impulse response of the PDN and is a result of electrical attributes of the PDN.

The term "transfer function" as used herein, refers to a frequency domain relationship between a current drawn by a SOC device from a PDN and a voltage signal occurring on a voltage plane of the SOC device as the current is drawn. Such a transfer function is said to be the transfer function of the PDN and is a result of electrical attributes of the PDN. The transfer function of the PDN may be derived from a corresponding impulse response of the PDN by taking the Fourier Transform (FT) of the impulse response of the PDN.

The terms "de-convolution" and "inverse convolution" are equivalent terms for a mathematical operation and are used interchangeably herein.

The term "developmental operation", as used herein, refers to the operation of a SOC device with a PDN, for example, in a laboratory environment for the purpose of determining a transfer function (and/or impulse response) of the PDN.

The term "standard field operation", as used herein, refers to the operation of a SOC device with a PDN in the environment for which the SOC device is ultimately intended to operate.

Figure 1:
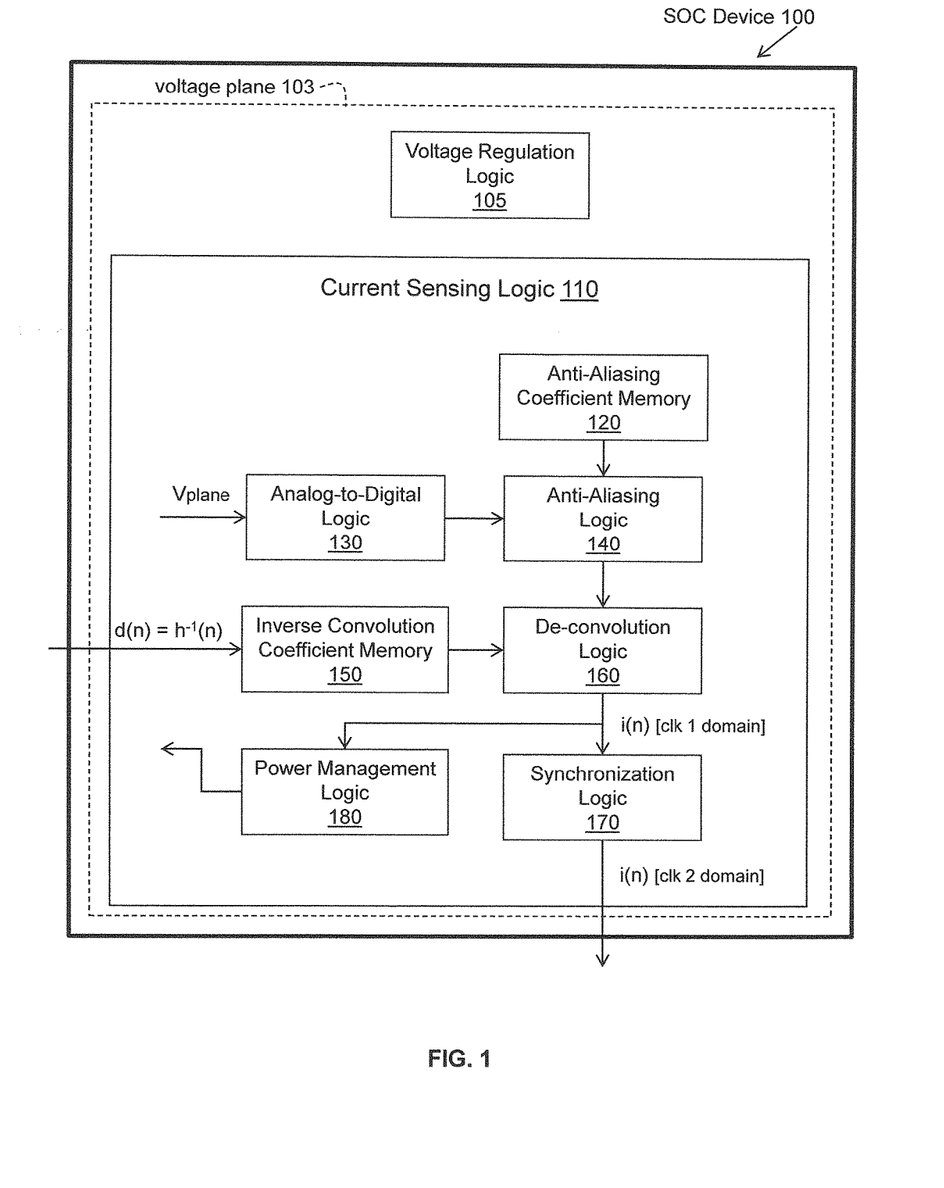
FIG. 1 illustrates one embodiment of a system-on-chip (SOC) device having a current sensing logic configured to recover current drawn from a power distribution network (PDN) for the purpose of managing power consumed by the SOC device.

FIG. 1 illustrates one embodiment of a system-on-chip (SOC) device 100 having a current sensing logic 110 configured to recover (estimate) current drawn from a power distribution network (PDN) for the purpose of managing power consumed by the SOC device 100. In one embodiment, the SOC device is in the form of an integrated circuit chip. Such an integrated circuit chip may be employed, for example, on a circuit board in a larger system. In one embodiment, the SOC device 100 is implemented largely in hardware and includes certain programmable features.

Figure 2:
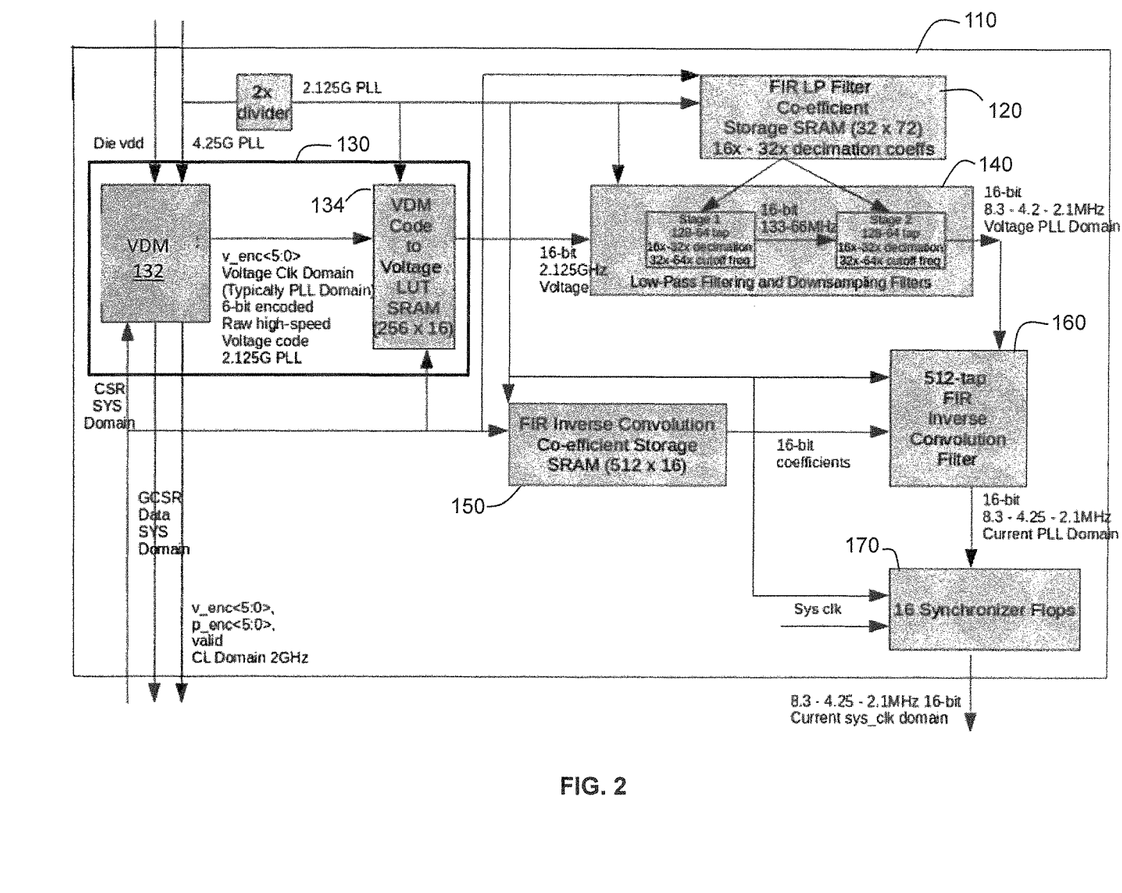
FIG. 2 illustrates one embodiment of the current sensing logic of the system-on-chip (SOC) device of FIG. 1, showing more detail than in FIG. 1.

FIG. 2 illustrates one embodiment of the current sensing logic 110 of the system-on-chip (SOC) device 100 of FIG. 1, showing more detail than in FIG. 1. As FIG. 1 is described herein, corresponding elements of FIG. 2 will also be addressed.

With reference to FIG. 1, in one embodiment, the SOC device 100 includes logics and memories for implementing various functional aspects of the SOC device 100. In one embodiment, the SOC device 100 includes a voltage plane 103 and voltage regulation logic 105. Furthermore, in one embodiment, the SOC device 100 includes current sensing logic 110. Current sensing logic 110 includes anti-aliasing coefficient memory 120, analog-to-digital (A/D) logic 130, anti-aliasing logic 140, inverse convolution memory 150, de-convolution logic 160, synchronization logic 170, and power management logic 180.

Similarly, in one embodiment, current sensing logic 110 of FIG. 2 includes logics corresponding to certain logics of current sensing logic 110 of FIG. 1. For example, current sensing logic 110 of FIG. 2 includes anti-aliasing coefficient memory 120, analog-to-digital (ND) logic 130, anti-aliasing logic 140, inverse convolution memory 150, de-convolution logic 160, and synchronization logic 170.

Other embodiments may provide different logics or combinations of logics that provide the same or similar functionality as the SOC device 100 of FIG. 1 or the current sensing logic 110 of FIG. 1 and FIG. 2. In one embodiment, the SOC device 100 of FIG. 1 is a programmable integrated circuit chip including executable algorithms and/or program modules configured to perform the functions of the logics. The executable algorithms and/or program modules are stored in a non-transitory computer storage medium on the SOC device 100. That is, in one embodiment, the logics of the SOC device 100 are implemented, at least in part, as modules of computer-executable instructions stored on a computer-readable medium.

Even though certain elements of the SOC device 100 are shown in FIG. 1 with respect to the function of current sensing, the SOC device 100 can include other elements for performing a primary function(s) of the SOC device 100. That is, in one embodiment, current sensing for the purpose of power management is considered a secondary (although very important) function of the SOC device.

Referring back to the logics and other elements of the SOC device 100 of FIG. 1, in one embodiment, the voltage plane 103 is configured to distribute an electrical potential (e.g., an analog voltage signal, $V_{plane}$) derived from a power lane, distribution network (PDN) to the various components of the SOC device 100. The voltage plane 103 may be in the form of a conductive layer of the SOC device 100, or may be in the form of one or more conductive rails of the SOC device 100, for example. Other configurations of the voltage plane 103 are possible as well, in accordance with other embodiments.

In accordance with one embodiment, voltage regulation logic 105 is part of the PDN, even though voltage regulation logic 105 is implemented on the SOC device 100. Voltage regulation logic 105 is configured to regulate the electrical potential (e.g., the analog voltage signal, $V_{plane}$) and provide the analog voltage signal to the voltage plane 103. In accordance with another embodiment, voltage regulation logic 105 is external to the SOC device 100 (i.e., voltage regulation logic 105 belongs to a part of the PDN that is external to the SOC device 100). Other portions of the PDN may be implemented internally and/or externally to the SOC device 100, in accordance with various embodiments. For example, the PDN may include all elements involved in delivering electrical power to a SOC device. Such elements may include electrical components, circuit traces, vias, as well as other elements.

Current sensing logic 110 is configured to recover or estimate a current signal, being drawn by the SOC device 100, from the analog voltage signal $V_{plane}$. The current signal being drawn is dependent, to a large extent, on the operating state of the SOC device. For example, the operating state of a SOC device can depend on a clock rate (operating frequency) of the SOC device, the various components of the SOC device, as well as other characteristics of the SOC device during operation.

The electrical power being consumed by the SOC device at any given time is proportional to the square of the current being drawn by the SOC device. Therefore, a knowledge of the electrical current being drawn can be used to control (manage) electrical power consumed. Once the current signal being drawn is determined from $V_{plane}$, that current signal can be used to manage the amount of electrical power being consumed by the SOC device 100 (e.g., by reducing the amount of current being drawn). In one embodiment, current sensing logic 110 includes analog-to-digital (ND) logic 130. ND logic 130 is configured to convert the analog voltage signal ($V_{plane}$) to t a digital voltage signal. As a result, subsequent signal processing by current sensing logic 110 is performed in the digital domain.

Referring to FIG. 2, in one embodiment, ND logic 130 includes voltage droop monitor (VDM) logic 132 and look-up table (LUT) 134. VDM logic 132 converts the analog voltage signal ($V_{plane}$, or Die Vdd in FIG. 2) to a digitally encoded signal. The digitally encoded signal is a 6-bit (low resolution) encoded signal having a clock rate of 2.125 GHz (high frequency) in a first clock domain clk 1 (e.g., a PLL domain). The digitally encoded signal addresses the LUT 134 which outputs a 16-bit (high-resolution) digital voltage signal having a clock rate of 2.125 GHz. In one embodiment, the LUT 134 is configured as a 256×16-bit SRAM.

In one embodiment, current sensing logic 110 of FIG. 1 includes anti-aliasing coefficient memory 120 and anti-aliasing logic 140. Anti-aliasing coefficient memory 120 is configured to store filtering coefficients to be used by anti-aliasing logic 140, and facilitate the loading of the filtering coefficients into anti-aliasing logic 140 from memory 120. Anti-aliasing logic 140 is configured to down sample and low-pass filter the digital voltage signal from ND logic 130. Down-sampling reduces the clock rate of the digital voltage signal from a higher clock rate to a lower clock rate, and low-pass filtering prevents signal aliasing problems due to the down-sampling.

Referring to FIG. 2, in one embodiment, anti-aliasing coefficient memory 120 is configured as a 32×72-bit FIR low-pass filter storage SRAM. Anti-aliasing logic 140 is configured as a two-stage low-pass filter (stage 1 and stage 2) which selectively decimates the 16-bit digital voltage signal out of ND logic 130 from a clock rate of 2.125 GHz to 2.1 MHz, 4.2 MHz, or 8.3 MHz (low frequency) in the first clock domain clk 1 (e.g., a PLL domain) while maintaining high resolution (16 bits).

In one embodiment, inverse convolution coefficient memory 150 in FIG. 1 is configured to store inverse convolution coefficients (de-convolution coefficients, d(n)) and facilitate the inputting of the inverse convolution coefficients into de-convolution logic 160. The inverse convolution coefficients, d(n), are derived from an impulse response, h(n), of the PDN (i.e., $d(n)=h^{-1}(n)$) and is discussed in detail later herein. The impulse response characterizes a relationship between the current signal drawn by the SOC device 100 and the analog voltage signal, $V_{plane}$, on the voltage plane 103. The impulse response is due to the electrical attributes of the PDN.

De-convolution logic 160 is configured to recover a current signal i(n), drawn by the SOC device 100, from the digital voltage signal (out of anti-aliasing logic 140) based at least in part on the inverse convolution coefficients derived from the impulse response of the PDN (i.e., using the inverse convolution coefficients, d(n), from memory 150). For example, in one embodiment:

$i(n)=v(n)\cdot *h^{-1}(n)$, or $i(n)=v(n)\cdot *d(n)$, where i(n) is the recovered current signal (in digital form) being drawn by the SOC device 100;
v(n) is the digital voltage signal (out of anti-aliasing logic 140) representing the analog voltage signal on the voltage plane, $V_{plane}$;
$h^{-1}(n)=d(n)$ and is the inverse impulse response derived from the impulse response h(n) and/or the transfer function H(s) of the PDN; and
·* is the convolution operator.

Determining the impulse response (h(n) in the time domain) of the PDN and/or the transfer function (H(s) in the frequency domain) of the PDN is discussed in detail later herein. The transfer function H(s) is simply the Fourier transform of the impulse response h(n). Furthermore, deriving the inverse impulse response $h^{-1}(n)$ from the impulse response h(n) is discussed in detail later herein as well.

Referring to FIG. 2, in one embodiment, inverse convolution coefficient memory 150 is configured as a 512×16 FIR inverse convolution coefficient storage SRAM. De-convolution logic 160 is configured as a 512-tap FIR inverse convolution filter. De-convolution logic 160 outputs an estimate of the current being drawn, i(n), in a 16-bit format at a clock rate of 2.1 MHz, 4.25 MHz, or 8.3 MHz in the first clock domain clk 1 (e.g., a PLL domain). In this manner, signal processing techniques can be used to effectively measure $V_{plane}$ and recover (estimate), from $V_{plane}$, the amount of current being drawn i(n) from the PDN by the SOC device at any given time (i.e., in real time).

In one embodiment, synchronization logic 170 is configured to transform the current signal i(n) from a first clock domain clk 1 (e.g., a PLL domain) to a second clock domain clk 2 (e.g., a system clock domain). The output of synchronization logic 170 is still an estimate of the current signal i(n) being drawn in a 16-bit format at a clock rate of 2.1 MHz, 4.25 MHz, or 8.3 MHz, but is now synchronized with the second clock domain clk 2 (e.g., a system clock domain). Referring to FIG. 2, in one embodiment, synchronization logic 170 is implemented as a 16-bit first-in-first-out (FIFO) device. By synchronizing the recovered current signal to the system clock domain, the recovered current signal may be used in other system applications that are external to the SOC device. For example, the recovered current signal may be used to adjust a parameter of portions of the PDN that are external to the SOC device (e.g., to adjust a supply voltage output by an external VDM).

In one embodiment, power management logic 180 is configured to change an amount of electrical power being consumed by the SOC device 100 in response to the current signal i(n). For example, in one embodiment, power management logic 180 is configured to reduce a frequency of operation (clock rate) of the SOC device 100, resulting in a reduction in the amount of electrical power consumed by the SOC device 100. In another embodiment, power management logic 180 is configured to reduce a supply voltage provided by voltage regulation logic 105 to the voltage plane 103, resulting in a reduction in the amount of electrical power consumed by the SOC device 100. In a further embodiment, power management logic 180 is configured to reduce both a frequency of operation (clock rate) of the SOC device 100 and a supply voltage provided by voltage regulation logic 105 to the voltage plane 103, resulting in a reduction in the amount of electrical power consumed by the SOC device 100.

For example, the current signal i(n) in the first clock domain clk 1 (e.g., the PLL domain) may be used to adjust parameters internal to the SOC device for the purpose of power management. The current signal i(n) in the second clock domain clk 2 (e.g., the system domain) may be used to adjust parameters of the PDN that are external to the SOC device for the purpose of power management.

In this manner, electrical power consumed by a SOC device can be managed in real time. The voltage signal on the voltage plane of the SOC device is effectively measured on the SOC device via signal processing techniques. The current signal being drawn by the SOC device is estimated from the voltage signal, via signal processing techniques, based on an impulse response (in the time domain) or transfer function (in the frequency domain) of a PDN providing electrical power to the SOC device. At least one parameter (e.g. a clock rate and/or a supply voltage) of the SOC device and/or PDN is adjusted based on the estimate of the current signal being drawn.

Figure 3:
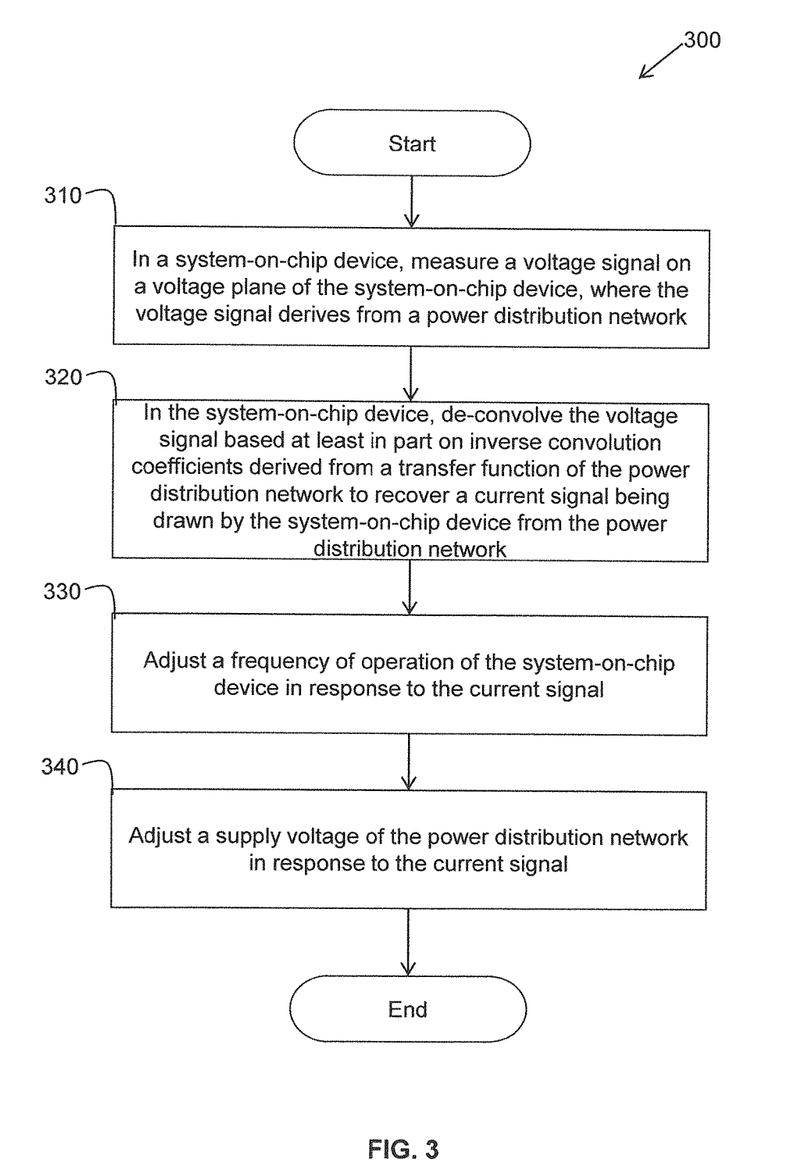
FIG. 3 illustrates one embodiment of a method, capable of being performed by the system-on-chip (SOC) device of FIG. 1, to recover a current signal from a voltage signal for the purpose of power management.

FIG. 3 illustrates one embodiment of a method 300, capable of being performed by the system-on-chip (SOC) device 100 of FIG. 1, to recover a current signal from a voltage signal for the purpose of power management. Method 300 may be implemented by a SOC device configured with algorithms that perform the method 300. For example, in one embodiment, method 300 is implemented by a SOC device configured to process data in electronic form and includes hardware and stored executable instructions that perform the functions of the method 300.

Method 300 will be described from the perspective that electrical power is provided to a SOC device through a power distribution network (PDN). Portions of the PDN may be external to the SOC device, and other portions of the PDN may be internal to the SOC device. The electrical power being consumed by the SOC device is proportional to the square of the current being drawn by the SOC device. Therefore, a knowledge of the electrical current being drawn can be used to control (manage) electrical power consumed. Method 300 assumes that an impulse response or transfer function of the PDN has been characterized through measurement and/or modeling. The impulse response or transfer function relates a voltage signal on the voltage plane of the SOC device to the current being drawn by the SOC device. Method 500, discussed later herein, is one embodiment of a PDN characterization process which determines the impulse response and/or transfer function of the PDN.

Upon initiating method 300, at block 310, in a SOC device, a voltage signal on a voltage plane of the SOC device is measured during operation of the SOC device. In one embodiment, the voltage signal derives from a PDN. For example, referring to FIG. 1, the voltage signal may be applied to the voltage plane 103 by voltage regulation logic 105, where voltage regulation logic 105 is part of the PDN.

In one embodiment, memory 120, A/D logic 130, and anti-aliasing logic 140 are involved in measuring the voltage signal, $V_{plane}$. For example, measuring the voltage signal may include performing an analog-to-digital conversion operation on the voltage signal (e.g., using ND logic 130). An input to ND logic 130 may be operably connected, via an operable connection, to the voltage plane 103. Furthermore, measuring the voltage signal may include performing an anti-aliasing filtering operation on a digital representation (e.g., out of A/D logic 130) of the voltage signal (e.g., using anti-aliasing logic 140). In accordance with one embodiment, the anti-aliasing filtering operation is a low-pass filtering operation. Also, measuring the voltage signal may include performing a down-sampling operation on a digital representation (e.g., out of ND logic 130) of the voltage signal (e.g., using anti-aliasing logic 140).

Memory 120 provides finite-impulse-response (FIR) coefficients used by anti-aliasing logic 140. In accordance with one embodiment, the FIR coefficients may be loaded into the memory 120 of the SOC device from, for example, an external computing device. The FIR coefficients may also be referred to herein as anti-aliasing filter coefficients, low-pass filter coefficients, or down sampling filter coefficients.

At block 320, in the SOC device, the voltage signal is de-convolved to recover (estimate) a current signal being drawn by the SOC device from the PDN. In one embodiment, the voltage signal is de-convolved based on a set of inverse convolution coefficients that are derived from a transfer function (or impulse response) of the PDN. The transfer function (or impulse response) characterizes a relationship between the current signal being drawn and the voltage signal on the voltage plane. The transfer function (or impulse response) is due to the electrical attributes associated with the PDN.

In one embodiment, memory 150 and de-convolution logic 160 are involved in de-convolving the voltage signal, $V_{plane}$. For example, memory 150 provides the inverse convolution coefficients d(n) which are derived from the transfer function H(s) of the PDN as:

h(n)=IFFT [H(s)], i.e., the impulse response h(n) is the inverse fast Fourier transform of the transfer function H(s), and $d(n)=h^{-1}(n)$, i.e., the inverse convolution coefficients d(n) are found by taking the inverse of the impulse response h(n). Details of converting h(n) to d(n) are provided later herein. In accordance with one embodiment, the inverse convolution coefficients d(n) may be loaded into the memory 150 of the SOC device from, for example, an external computing device.

In one embodiment, de-convolution logic 160 performs a de-convolution operation (which is a convolution operation using the inverse convolution coefficients) on the voltage signal as:

$i(n)=v(n)\cdot^* d(n)$, where i(n) is the recovered current signal (in digital form) being drawn by the SOC device;

v(n) is the digital voltage signal (e.g., out of anti-aliasing logic 140) representing the analog voltage signal on the voltage plane, $V_{plane}$;

·* is the convolution operator; and d(n) is the set of inverse convolution coefficients.

At block 330, once the current signal is recovered, a frequency of operation (clock rate) of the SOC device may be adjusted in response to the current signal. For example, in one embodiment, the current signal i(n) can be input to power management logic 180 (see FIG. 1). Power management logic 180 can, for example, reduce the PLL domain clock rate within the SOC device 100 to reduce the electrical power consumption of the SOC device 100.

At block 340, once the current signal is recovered, a supply voltage provided by the PDN to the voltage plane of the SOC device can be adjusted in response to the current signal. For example, in one embodiment, the current signal i(n) can be input to power management logic 180 (see FIG. 1). Power management logic 180 can, for example, command voltage regulation logic 105 to reduce the supply voltage being output to the voltage plane 103 to reduce the electrical power consumption of the SOC device 100. However, in some embodiment, block 330 may be performed and block 340 may not be performed. Similarly, in some other embodiments, block 340 may be performed and block 330 may not be performed.

In this manner, the amount of electrical power being consumed by a SOC device can be controlled (managed) based on a knowledge of the current being drawn by the SOC device from a PDN. The electrical power being consumed by the SOC device is proportional to the square of the current being drawn by the SOC device. Characterizing a transfer function and/or impulse response of the PDN allows a voltage signal occurring on a voltage plane of the SOC device to be related to the current being drawn by the SOC device. As a result, a current signal can be recovered (estimated) from the voltage signal in real time and used to manage an amount of electrical power consumed in real time.

Systems, methods, and other embodiments are disclosed for determining the impulse response (in the time domain) and/or the transfer function (in the frequency domain) of the PDN. In one embodiment, the transfer function is a Fourier Transform (FT) of the impulse response, and the impulse response is the Inverse Fourier Transform (IFT) of the transfer function. Again, the impulse response (and/or transfer function) of the PDN relates the voltage on the voltage plane of the SOC device to the current being drawn by the SOC device from the PDN. The impulse response (and/or transfer function) of the PDN can be characterized in a laboratory, for example. In one embodiment, in the laboratory, the drawing of a characterizing current into the SOC device from the PDN is induced, and the resulting voltage response on the voltage plane of the SOC device is measured. The impulse response (and/or transfer function) of the PDN is derived from the resulting voltage response. De-convolution coefficients can be derived from the impulse response (and/or transfer function). The de-convolution coefficients can then be used by the SOC device during a standard field operation to de-convolve the operating voltage measured on the voltage plane of the SOC device to recover the operating current being drawn by the SOC device in real time.

Figure 4:
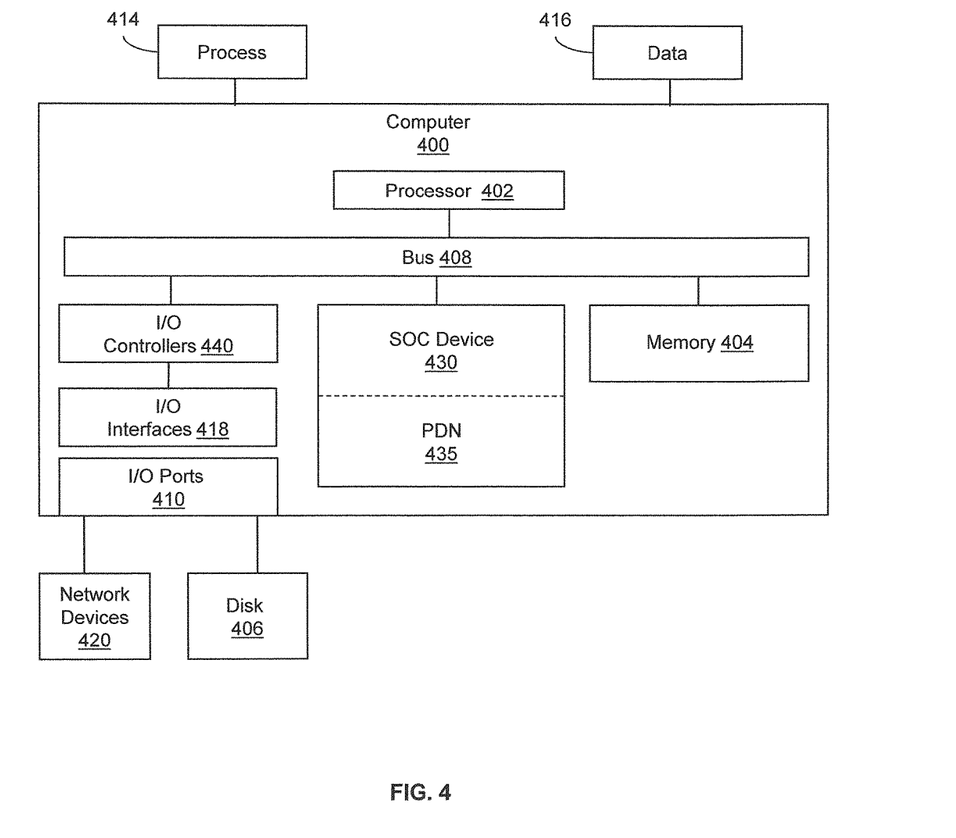
FIG. 4 illustrates one embodiment of a computing system upon which the method of FIG. 5 may be implemented to characterize a transfer function of a power distribution network supplying electrical power to a system-on-chip (SOC) device.
Figure 5:
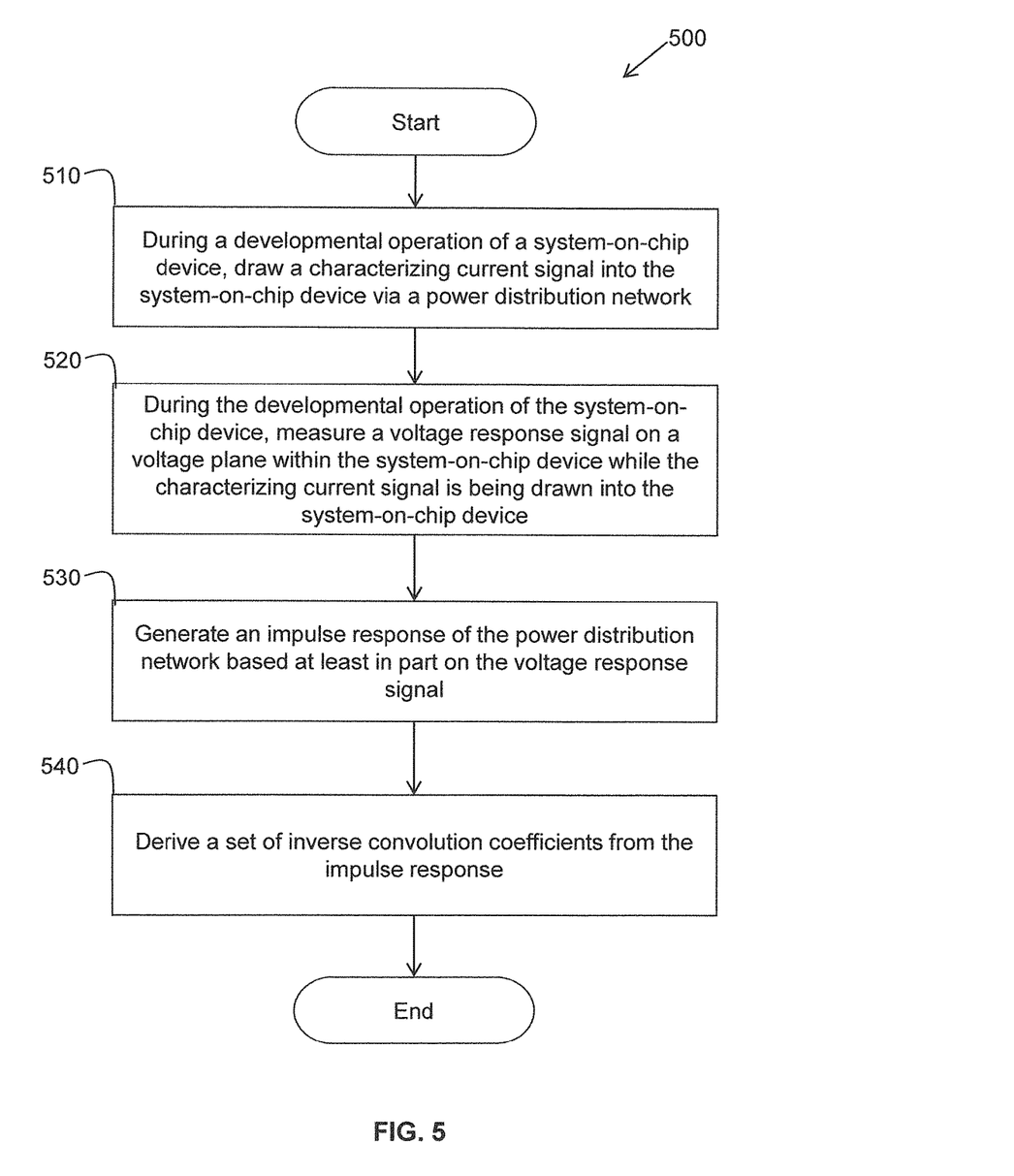
FIG. 5 illustrates one embodiment of a method to characterize a transfer function of a power distribution network supplying electrical power to a system-on-chip (SOC) device.

FIG. 4 illustrates one embodiment of a computing device upon which the method 500 of FIG. 5 may be implemented to characterize a transfer function of a power distribution network supplying electrical power to a system-on-chip (SOC) device. FIG. 4 illustrates one example embodiment of a computing device upon which an embodiment of a SOC device and associated PDN may be implemented for the purpose of determining an impulse response (and/or transfer function) of the PDN. The example computing device may be a computer 400 that includes a processor 402, a memory 404, and input/output ports 410 operably connected by a bus 408.

In one example, the computer 400 may include SOC device 430 (corresponding to SOC device 100 from FIG. 1) and PDN 435 configured as disclosed herein to estimate (recover) the electrical current drawn by the system-on-chip (SOC) device 430 from the PDN 435. A dashed line is shown between the SOC device 430 and the PDN 435 in FIG. 4 to indicate that a portion of the PDN 435 may be external to the SOC device 430, and another portion of the PDN 435 may be internal to the SOC device 430.

In different examples, the SOC device 430 may be implemented in hardware (an integrated circuit chip) or as combinations of hardware, a non-transitory computer-readable medium with stored instructions, and/or firmware. While the SOC device 430 is illustrated as a hardware component attached to the bus 408, it is to be appreciated that in other embodiments, the SOC device 430 could be an integrated circuit chip implemented as part of the processor 402, the memory 404, or the disk 406, for example.

In one embodiment, the SOC device 430 (or the computer 400 as a whole) is a means (e.g., structure: hardware, non-transitory computer-readable medium, firmware) for performing the actions described. The means may be implemented, for example, as an ASIC programmed to induce the drawing of a characterizing current from the PDN and sample and measure a voltage signal resulting on a voltage plane of the ASIC. The means may also be implemented as stored computer executable instructions configured to derive an impulse response (and/or transfer function) of the PDN from the voltage signal, and derive de-convolution coefficients from the impulse response (and/or transfer function). The stored computer executable instructions may be presented to computer 400 as data 416 and may be temporarily stored in memory 404 and then executed by processor 402.

The SOC device 430 may also provide means (e.g., hardware, non-transitory computer-readable medium that stores executable instructions, firmware) for estimating (recovering) the electrical current drawn by the SOC device 430 from the PDN 435. The electrical current drawn can be estimated once the impulse response (and/or transfer function) of the PDN 435 is determined and the de-convolution coefficients are derived from the impulse response (and/or transfer function). By knowing the electrical current being drawn, the electrical power consumed by the SOC device 430 can be managed to avoid over-heating of the SOC device 430 and to avoid damaging the PDN 435. In one embodiment, the electrical current being drawn by a SOC device 430 is estimated based on the voltage occurring on a voltage plane of the SOC device 430 and the de-convolution coefficients.

Generally describing an example configuration of the computer 400, the processor 402 may be a variety of various processors including dual microprocessor and other multi-processor architectures. A memory 404 may include volatile memory and/or non-volatile memory. Non-volatile memory may include, for example, ROM, PROM, and so on. Volatile memory may include, for example, RAM, SRAM, DRAM, and so on.

A storage disk 406 may be operably connected to the computer 400 via, for example, an input/output interface (e.g., card, device) 418 and an input/output port 410. The disk 406 may be, for example, a magnetic disk drive, a solid state disk drive, a floppy disk drive, a tape drive, a Zip drive, a flash memory card, a memory stick, and so on. Furthermore, the disk 406 may be a CD-ROM drive, a CD-R drive, a CD-RW drive, a DVD ROM, and so on. The memory 404 can store a process 414 and/or a data 416, for example. The disk 406 and/or the memory 404 can store an operating system that controls and allocates resources of the computer 400.

The computer 400 may interact with input/output devices via the i/o interfaces 418 and the input/output ports 410. Input/output devices may be, for example, a keyboard, a microphone, a pointing and selection device, cameras, video cards, displays, the disk 406, the network devices 420, and so on. The input/output ports 410 may include, for example, serial ports, parallel ports, and USB ports.

The computer 400 can operate in a network environment and thus may be connected to the network devices 420 via the i/o interfaces 418, and/or the i/o ports 410. Through the network devices 420, the computer 400 may interact with a network. Through the network, the computer 400 may be logically connected to remote computers. Networks with which the computer 400 may interact include, but are not limited to, a LAN, a WAN, and other networks.

FIG. 5 illustrates one embodiment of a method 500 to characterize a transfer function and/or impulse response of a power distribution network (PDN) supplying electrical power to a system-on-chip (SOC) device. Method 500 may be implemented, for example, by a computing system which incorporates the SOC device and the PDN (e.g., see FIG. 4). The computing system is configured with algorithms that perform the method 500. For example, in one embodiment, method 500 is implemented by computer 400 configured to process data in electronic form and includes hardware and stored executable instructions that perform the functions of the method 500. Some of the algorithms may be internal to the SOC device and other algorithms may be external to the SOC device.

Method 500 will be described from the perspective that electrical power is provided to a SOC device through a power distribution network (PDN). Portions of the PDN may be external to the SOC device, and other portions of the PDN may be internal to the SOC device. The electrical power being consumed by the SOC device is proportional to the square of the current being drawn by the SOC device. Therefore, a knowledge of the electrical current being drawn can be used to control (manage) electrical power being consumed.

Method 500 assumes that an impulse response or transfer function of the PDN can be characterized in the laboratory during a developmental operation of the SOC device. The impulse response or transfer function of the PDN relates a voltage signal on the voltage plane of the SOC device to a current being drawn by the SOC device. Method 500 provides one embodiment of a PDN characterization process which determines the impulse response or transfer function of the PDN. By knowing the impulse response and/or transfer function of the PDN, a set of inverse convolution coefficients can be derived and implemented within the SOC device, allowing a current drawn by the SOC device to be estimated from a voltage measured at the voltage plane.

Upon initiating method 500, at block 510, a characterizing current signal is drawn into the SOC device from an associated power distribution network (PDN). In accordance with one embodiment, the developmental operation of the SOC device forces the SOC device into one or more operational states which result in the characterizing current signal being drawn. The one or more operational states may be determined through experimentation for a specific combination of a SOC device and a PDN.

Figure 6A:
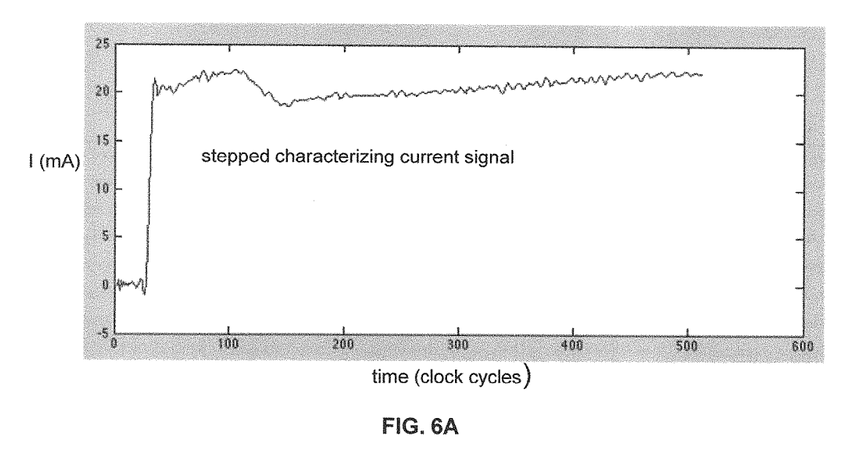
FIG. 6A illustrates a diagram showing an embodiment of a stepped current signal generated as part of the method of FIG. 5.

In accordance with one embodiment, the characterizing current signal is a stepped current signal whose amplitude approximates a step function with respect to time. FIG. 6A illustrates a diagram showing an embodiment of a stepped current signal generated as part of the method 500 of FIG. 5. The stepped current signal jumps from zero (0) milliamperes to around twenty (20) milli-amperes over just a few clock cycles, and remains near the twenty (20) milli-ampere level. Ideally, the characterizing current signal would approximate an impulse function, since it is the impulse response of the PDN that is to be determined. However, generating such an impulse current signal is difficult in practice. Furthermore, an impulse response can be derived from a step response (i.e., from a response to a stepped function).

Figure 6B:
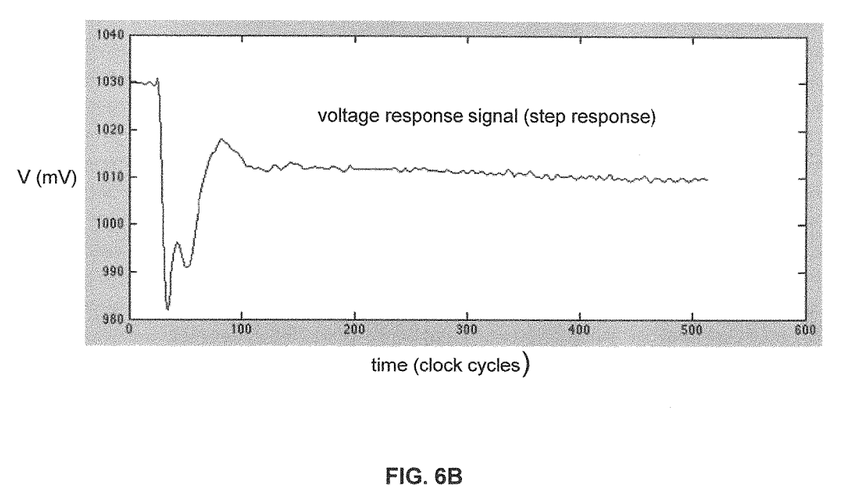
FIG. 6B illustrates a diagram showing an embodiment of a voltage response signal measured as part of the method of FIG. 5.

At block 520, a voltage response signal (step response) is measured on the voltage plane of the SOC device while the characterizing current signal is being drawn into the SOC device. The voltage response signal derives from the PDN in response to the characterizing current signal being drawn. The voltage response signal is referred to as the step response because the amplitude of the voltage response signal is the voltage that occurs on the voltage plane of the SOC device over time in response to drawing the stepped current signal. FIG. 6B illustrates a diagram showing an embodiment of a voltage response signal measured as part of the method 500 of FIG. 5.

Referring to FIG. 1, in one embodiment, the voltage response signal (step response) can be measured by a combination of memory 120, ND logic 130, and antialiasing logic 140 as described previously herein. In accordance with other embodiments, referring to FIG. 2, the voltage response signal (step response) can be taken at the output of the VDM 132 of A/D logic 130, or at the output of LUT 134 of ND logic 130.

The voltage response signal is a step response and not an impulse response. Therefore, at block 530, the impulse response of the PDN is generated based at least in part on the voltage response signal (i.e., the step response). In accordance with one embodiment, the impulse response is derived from the step response by taking the mathematical derivative of the step response. For example, referring to the computing system of FIG. 4, the step response (voltage response signal) can be output, in digital form, from the SOC device 430, over a bus 408, to a processor 402. In one embodiment, the step response is output from the SOC device via antialiasing logic 140 (see FIG. 1). In another embodiment, the step response is output from the SOC device via ND logic 130. The processor 402 can take the mathematical derivative of the step response to generate the impulse response h(n). In one embodiment, the impulse response h(n) is represented as a set of convolution coefficients.

Even though a very specific characterizing current signal (a stepped current signal) is drawn into the SOC device via the PDN, and the resulting voltage response is measured, the derived impulse response fully characterizes the PDN. That is, the impulse response characterizes the relationship (due to the electrical attributes of the PDN) between any operating current drawn by the SOC device and a corresponding operating voltage occurring on the voltage plane of the SOC device during a standard field operation of the SOC device with the PDN.

It is noted here again that the transfer function H(s) of the PDN is simply the frequency domain representation of the impulse response h(n), which is a time domain representation. For example, the transfer function H(s) can be mathematically derived from the impulse response h(n) by taking the Fourier transform (e.g., FFT) of h(n). Similarly, the impulse response h(n) can be mathematically derived from the transfer function H(s) by taking the inverse Fourier transform (e.g., IFFT) of H(s). Therefore, determining the impulse response h(n) of a PDN in the time domain is considered herein to be effectively equivalent to determining the transfer function H(s) of the PDN in the frequency domain.

Figure 7:
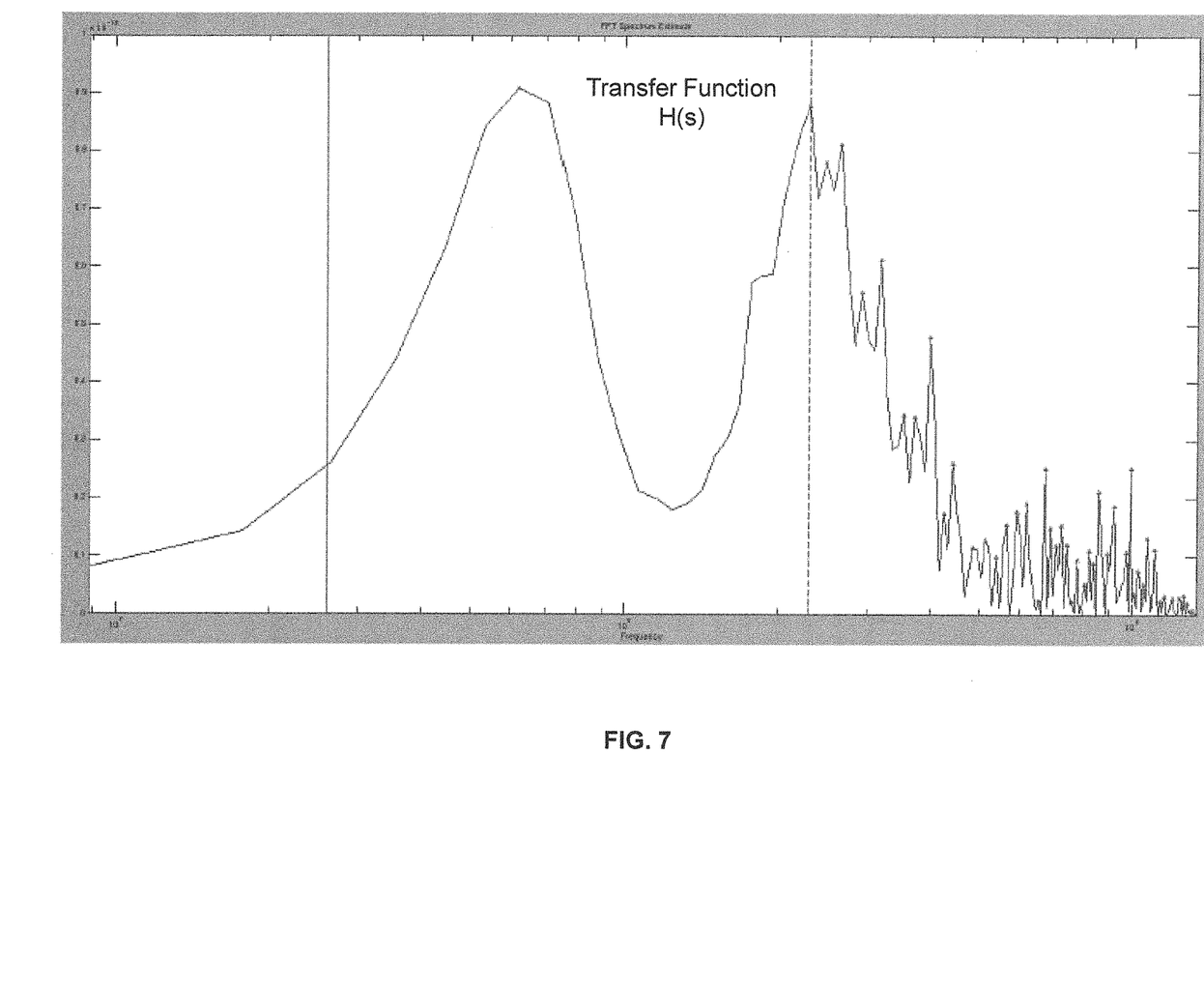
FIG. 7 illustrates a diagram showing an embodiment of a transfer function of a power distribution network (PDN) generated based at least in part on the stepped current signal of FIG. 6A and the voltage response signal of FIG. 6B.

Often, in practice, the measured voltage response (measured step response) to the stepped current signal can include a significant amount of noise (e.g., electrical noise). Taking the derivative of the step response to obtain the impulse response can actually make the noise worse. The noise can be greatly reduced by first performing operations in the frequency domain. Referring to FIG. 4, in accordance with one embodiment, the processor 402 is configured to take the Fourier transform (e.g., FFT) of the measured step response to generate the transfer function H(s). FIG. 7 illustrates a diagram showing an embodiment of the transfer function H(s) of a power distribution network (PDN) generated based at least in part on the voltage response signal of FIG. 6B.

Figure 8:
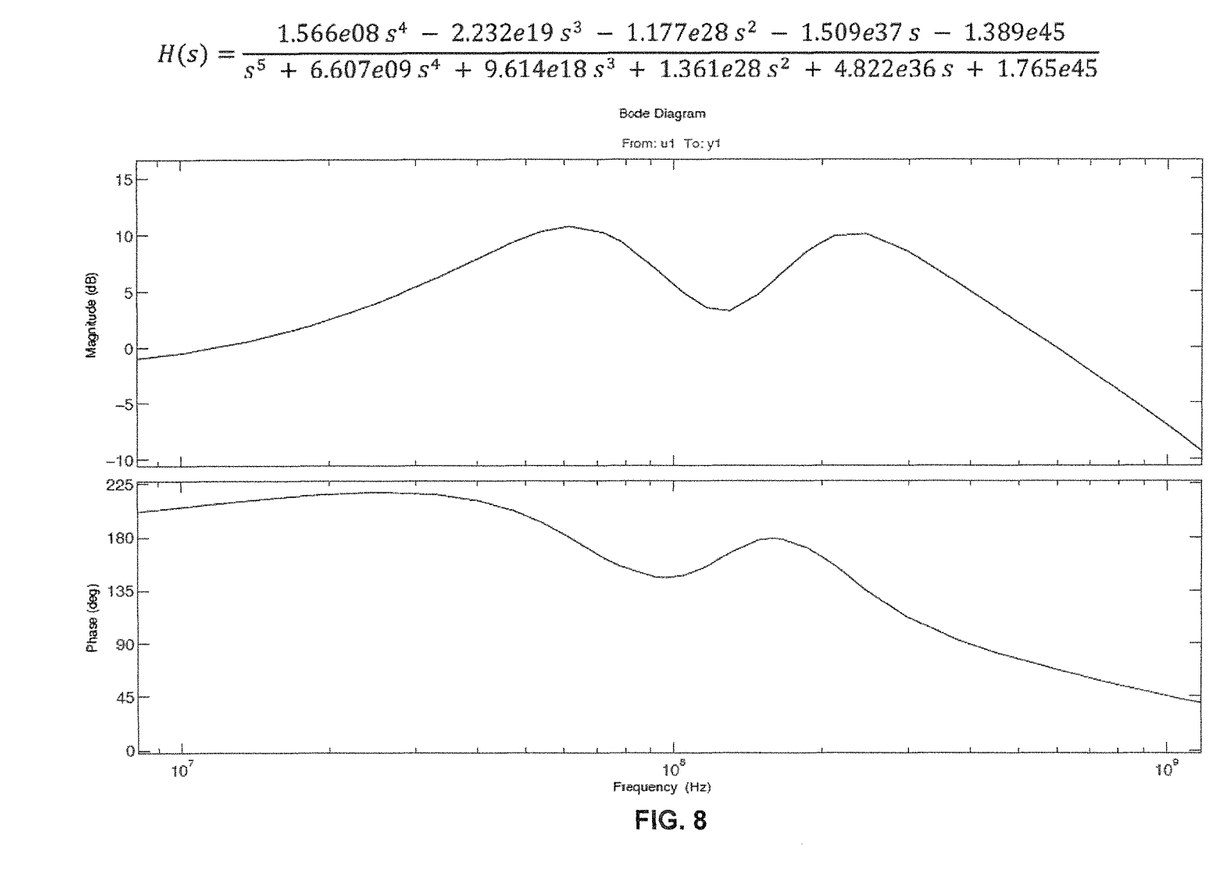
FIG. 8 illustrates a diagram showing an embodiment of a magnitude and phase of the transfer function of FIG. 7 resulting from a curve fitting process.

However, the transfer function H(s) can still include significant noise. In one embodiment, the processor 402 is configured to fit a relatively smooth curve to the transfer function H(s). Such curve fitting can greatly reduce the amount of noise present in the transfer function H(s). FIG. 8 illustrates a diagram showing an embodiment of a magnitude and phase of the transfer function of FIG. 7 resulting from a curve fitting process. Again, such a curve fitting process can be performed by the processor 402 of FIG. 4, in accordance with one embodiment, to help characterize the transfer function H(s) as a mathematical equation (see top portion of FIG. 8) and reduce the noise. Then, in accordance with one embodiment, the processor 402 can take the inverse Fourier transform (e.g., IFFT) of the curve fitted transfer function H(s) to generate the impulse response h(n). Noise is the resultant impulse response h(n) is greatly reduced, if not effectively eliminated.

At block 540, a set of inverse convolution coefficients d(n) are derived from the impulse response h(n). In particular, expressed mathematically, $d(n)=h^{-1}(n)$. That is, d(n) is the inverse of the impulse response. It is desired to derive d(n) since, in one embodiment, the SOC device recovers the drawn current signal i(n) from the voltage signal v(n) on the voltage plane by performing the operation $i(n)=v(n)\cdot{}^*d(n)$, as discussed previously herein. Since determining the impulse response h(n) of a PDN in the time domain is equivalent to determining the transfer function H(s) of the PDN in the frequency domain, then deriving d(n) from h(n) can be considered equivalent to deriving d(n) from H(s).

In accordance with one embodiment, once h(n) of a PDN is determined, d(n) can be derived from h(n) by processor 402 of computer 400, for example. In discrete time, i(n)·*h(n)=v(n). The convolution operation ·* can be performed using matrix linear algebra. First, a convolution matrix is formed from the impulse response h(n) as H[ ] with dimensions N×N, where [ ] denotes a matrix. Then, the convolution can be computed via matrix multiplication as:

$$i[\ ]_{1 \times N} {}^* H[\ ]_{N \times N} = v[\ ]_{1 \times N}.$$

Next, multiplication by the inverse convolution matrix is performed as:

$$i[\ ]_{1 \times N} {}^* H[\ ]_{N \times N} {}^* H^{-1}[\ ]_{N \times N} = v[\ ]_{1 \times N} {}^* H^{-1}[\ ]_{N \times N},$$

and results in:

$$i[\ ]_{1 \times N} = v[\ ]_{1 \times N} {}^* H^{-1}[\ ]_{N \times N}.$$

Next, d(n), which equals $h^{-1}(n)$, is taken as being equal to the first row of the matrix $H^{-1}[\ ]N \times N$ that begins with a value of zero (0). Then, $$i(n) = v(n) \cdot {}^* h^{-1}(n), \text{ or } i(n) = v(n) \cdot {}^* d(n).$$

In this manner, the inverse convolution coefficients d(n) can be derived for a PDN associated with a SOC device in the laboratory (e.g., using the computer of FIG. 4) during a developmental operation of the SOC device. The inverse convolution coefficients d(n) can then be loaded into the SOC device (e.g., into inverse convolution coefficient memory 150 of FIG. 1). During real time standard field operation of the SOC device, the inverse convolution coefficients d(n) can be used by the SOC device (e.g., by de-convolution logic 160 of FIG. 1) to recover a drawn current signal from a voltage signal occurring on a voltage plane (e.g., voltage plane 103 of FIG. 1) of the SOC device. As the drawn current signal is continuously recovered over time, the electrical power consumed by the SOC device can be adjusted in response to the drawn current signal to manage power consumption.

Systems, methods, and other embodiments have been described that are configured to provide on-chip current sensing by employing a power distribution network voltage de-convolution technique. In one embodiment, a system-on-chip device includes a voltage plane configured to carry an analog voltage signal derived from a power distribution network. Analog-to-digital logic is configured to convert the analog voltage signal to a digital voltage signal. De-convolution logic is configured to recover a current signal, drawn by the system-on-chip device, from the digital voltage signal based at least in part on inverse convolution coefficients derived from an impulse response of the power distribution network. The impulse response characterizes a relationship between the current signal drawn and the analog voltage signal on the voltage plane, due to electrical attributes of the power distribution network. The recovered current signal may be used to perform power management functions, within and/or external to the system-on-chip device, to control the amount of electrical power consumed by the system-on-chip device.

Definitions and Other Embodiments

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on. In one embodiment, a computing device is implemented with one or more executable algorithms that are configured to perform any of the disclosed methods.

In one or more embodiments, the disclosed methods or their equivalents are performed by either: computer hardware configured to perform the method; or computer software embodied in a non-transitory computer-readable medium including an executable algorithm configured to perform the method.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C § 101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
FFT: Fast Fourier Transform
IFFT: Inverse Fast Fourier Transform
LAN: local area network.
RAM: random access memory.
DRAM: dynamic RAM.
SRAM: synchronous RAM.
ROM: read only memory.
PROM: programmable ROM.
PLL: phase locked loop
USB: universal serial bus.
WAN: wide area network.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). An operable connection may include one entity generating data and storing the data in a memory, and another entity retrieving that data from the memory via, for example, instruction control. Logical and/or physical communication channels can be used to create an operable connection.

"Computer-readable medium" or "computer storage medium", as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C § 101.

"Logic", as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable application would be selected to implement the functions. Logic is limited to statutory subject matter under 35 U.S.C. § 101.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. § 101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

To the extent that the phrase "one or more of, A, B, and C" is used herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be used.

What is claimed is:

1. A method of sensing a current signal, the method comprising:
    in a system-on-chip device:
        measuring a voltage signal on a voltage plane of the system-on-chip device during operation of the system-on-chip device, wherein the voltage signal derives from a power distribution network;
        de-convolving the voltage signal, based at least in part on inverse convolution coefficients stored within memory of the system-on-chip device and derived from the power distribution network, to recover a current signal being drawn by the system-on-chip device from the power distribution network in a first clock domain, wherein the inverse convolution coefficients, the voltage signal, and a convolution operator are used to determine the current signal, wherein the de-convolving comprises:
            converting the current signal from the first clock domain in which the current signal was outputted to a second clock domain to synchronize the current signal with the second clock domain for adjusting a parameter of the power distribution network;
        determining a power consumption of the system-on-chip device based upon the current signal; and
        adjusting at least one of a clock rate of the system-on-chip device or a supply voltage provided by the power distribution network to the voltage plane based upon the power consumption to reduce an amount of electrical power consumed by the system-on-chip device.

2. The method of claim 1, wherein the inverse convolution coefficients are derived from a transfer function of the power distribution network that characterizes a relationship between the current signal being drawn and the voltage signal on the voltage plane, due to electrical attributes of the power distribution network.

3. The method of claim 1, wherein the measuring includes performing an analog-to-digital conversion operation on the voltage signal.

4. The method of claim 1, wherein the measuring includes performing an anti-aliasing filtering operation on a digital representation of the voltage signal.

5. The method of claim 1, wherein the measuring includes performing a low-pass filtering operation on a digital representation of the voltage signal.

6. The method of claim 1, wherein the measuring includes performing a down-sampling operation on a digital representation of the voltage signal.

7. The method of claim 1, further comprising loading the inverse convolution coefficients into the memory of the system-on-chip device.

8. The method of claim 1, further comprising loading anti-aliasing filter coefficients into the memory of the system-on-chip device.

9. The method of claim 1, further comprising loading down sampling filter coefficients into the memory of the system-on-chip device.

10. The method of claim 1, further comprising adjusting a frequency of operation of the system-on-chip device in response to at least one of the current signal or the power consumption.

11. A system-on-chip device, comprising:
a voltage plane configured to carry an analog voltage signal derived from a power distribution network;
analog-to-digital logic configured to convert the analog voltage signal to a digital voltage signal;
de-convolution logic configured to recover a current signal, drawn by the system-on-chip device, from the digital voltage signal based at least in part on inverse convolution coefficients stored within memory of the system-on-chip device and derived from the power distribution network in a first clock domain, wherein the de-convolution logic uses the inverse convolution coefficients, the voltage signal, and a convolution operator to determine the current signal;
synchronization logic configured to convert the current signal from the first clock domain in which the current signal was outputted to a second clock domain to synchronize the current signal with the second clock domain for adjusting a parameter of the power distribution; and
power management logic configured to:
determine a power consumption of the system-on-chip device based upon the current signal; and
adjust at least one of a clock rate of the system-on-chip device or a supply voltage provided by the power distribution network to the voltage plane based upon the power consumption to reduce an amount of electrical power consumed by the system-on-chip device.

12. The system-on-chip device of claim 11, wherein the inverse convolution coefficients are derived from an impulse response of the power distribution network which characterizes a relationship between the current signal drawn and the analog voltage signal on the voltage plane, due to electrical attributes of the power distribution network.

13. The system-on-chip device of claim 11, wherein the memory comprises an inverse convolution coefficient memory configured to:
store the inverse convolution coefficients; and
input the inverse convolution coefficients into the de-convolution logic.

14. The system-on-chip device of claim 11, wherein the power distribution network includes voltage regulation logic configured to regulate the analog voltage signal provided to the voltage plane.

15. The system-on-chip device of claim 11, further comprising anti-aliasing logic configured to low pass filter the digital voltage signal further comprising synchronization logic configured to transform the current signal.

16. The system-on-chip device of claim 11, wherein the power management logic is configured to change an amount of electrical power being consumed by the system-on-chip device in response to at least one of the current signal or the power consumption.

17. The system-on-chip device of claim 11, further comprising anti-aliasing logic configured to low pass filter and down sample the digital voltage signal.

18. A method comprising:
measuring a voltage signal on a voltage plane of a system-on-chip device during operation of the system-on-chip device, wherein the voltage signal derives from a power distribution network;
de-convolving the voltage signal, based at least in part on inverse convolution coefficients stored within memory of the system-on-chip device and derived from the power distribution network, to recover a current signal being drawn by the system-on-chip device from the power distribution network in a first clock domain, wherein de-convolution logic uses the inverse convolution coefficients, the voltage signal, and a convolution operator to determine the current signal, wherein the de-convolving comprises:
converting the current signal from the first clock domain in which the current signal was outputted to a second clock domain to synchronize the current signal with the second clock domain for adjusting a parameter of the power distribution network;
determining a power consumption of the system-on-chip device based upon the current signal; and
adjusting at least one of a clock rate of the system-on-chip device or a supply voltage provided by the power distribution network to the voltage plane based upon the power consumption to reduce an amount of electrical power consumed by the system-on-chip device.

19. The method of claim 18, wherein the inverse convolution coefficients are derived from a transfer function of the power distribution network that characterizes a relationship between the current signal being drawn and the voltage signal on the voltage plane, due to electrical attributes of the power distribution network.

20. The method of claim 18, wherein the measuring includes performing an anti-aliasing filtering operation on a digital representation of the voltage signal.

* * * * *

UNITED STATES PATENT AND TRADEMARK OFFICE
CERTIFICATE OF CORRECTION

PATENT NO.        : 10,120,000 B2
APPLICATION NO.   : 14/799664
DATED             : November 6, 2018
INVENTOR(S)       : Turullols Page 1 of 1

It is certified that error appears in the above-identified patent and that said Letters Patent is hereby corrected as shown below:

In the Specification

In Column 3, Line 47, delete "(ND)" and insert -- (A/D) --, therefor.

In Column 4, Line 50, delete "to t a" and insert -- to a --, therefor.

In the Claims

In Column 18, Lines 15-16, in Claim 15, after "voltage" delete "signal further comprising synchronization logic configured to transform the current".

Signed and Sealed this
Twenty-ninth Day of October, 2019

Andrei Iancu
*Director of the United States Patent and Trademark Office*